United States Patent [19]

Kohl et al.

[11] 4,404,072

[45] Sep. 13, 1983

[54] PHOTOELECTROCHEMICAL PROCESSING OF III-V SEMICONDUCTORS

[75] Inventors: Paul A. Kohl; Frederick W. Ostermayer, Jr., both of Chatham, N.J.

[73] Assignee: Bell Telephone Laboratories, Incorporated, Murray Hill, N.J.

[21] Appl. No.: 275,805

[22] Filed: Jun. 22, 1981

[51] Int. Cl.$^3$ ............................................. C25F 3/12
[52] U.S. Cl. .................................. 204/129.3; 156/643
[58] Field of Search ...................... 156/643; 204/129.3

[56] References Cited

U.S. PATENT DOCUMENTS 3,890,215  6/1975  Di Lorenzo et al. ............ 204/129.2

OTHER PUBLICATIONS

D'Asars et al., IEEE Transactions on Electronic Devices, ED-25, No. 10, Oct. 1978, pp. 1218-1221.
D. J. Ehrlich et al., American Institute of Physics, 4/15/80, pp. 698-700.
R. W. Haisty, Journal of the Electrochemical Society, Aug. 1961, pp. 790-794.
F. Kuhn-Kuhnenfeld, Journal of the Electrochemical Society, Aug. 1972, pp. 1063-1078.
D. Lubzens, Electronics Letters, Feb. 1977, vol. 13, pp. 171-172.
L. Hollan et al., Journal of the Electrochemical Society, May 79, vol, 126, No. 5, pp. 855-859.
Zh. I. Alferov et al., Soviet Physics Technical Physics, Jul. 76, vol. 21, No. 7, pp. 857-859.
A. B. J. Sullivan, Electronics Letters, Mar. 76, vol. 12, No. 6, pp. 133-134.
A. A. England et al., Solid-State Electronics, 1981, vol. 24, pp. 337-342.

*Primary Examiner*—G. L. Kaplan
*Assistant Examiner*—N. X. Nguyen
*Attorney, Agent, or Firm*—Walter G. Nilsen

[57] ABSTRACT

A photoelectrochemical process is described for anisotropic etching of intrinsic III-V compound semiconductors. Such a process is highly advantageous because the etching takes place only where light is incident on the surface of the semiconductor. Thus, various patterns can be etched into the semiconductor surface without the use of a mask, undercutting is minimized where masks are used and the shape of the hole etched out of the surface can be controlled.

16 Claims, 2 Drawing Figures

PHOTOELECTROCHEMICAL PROCESSING OF III-V SEMICONDUCTORS

TECHNICAL FIELD

The invention is a process for photoelectrochemical etching intrinsic compound semiconductors.

BACKGROUND OF THE INVENTION

The development of new semiconductor materials and improved methods of making semiconductor materials have increased the variety of devices which can be made. Many such devices require improved processing procedures which either result in more precise or accurate location of geometric features on the semiconductor body or more accurate reproduction of desirable geometric features on the semiconductor material. A particular case in point is devices utilizing intrinsic III-V compound semiconductor material. This material may be used in a variety of applications including as substrate material for various devices. Typical devices are gallium arsenide field-effect transistors (including such devices operated in the high frequency and microwave region), various types of III-V integrated circuits and devices involving arrays of detectors and diodes including light-emitting diodes.

Particularly desirable is a procedure for etching III-V intrinsic semiconductor material in which the etching is confined to a predetermined region, where the shape of the etched hole can be controlled and the extent of etching can be predetermined.

In many device fabrication procedures involving intrinsic III-V semiconductor material, it is desirable to produce holes with particular shapes, most often with straight-sided walls essentially free of etch facets (see for example L. A. D'Asaro, J. V. DiLorenzo and H. Fukui, *IEEE Transactions on Electron Devices*, ED-25, No. 10, October 1978, page 1218). Here, a microwave device is described and the shape of the hole through the intrinsic GaAs to the source electrode has a significant effect on device performance. Also, good control over the shape of geometric features (such as straight-sided holes or channels) on a semiconductor wafer allows closer packing of individual devices. This permits a larger yield of devices from the same wafer and fabrication procedure.

Here, it is desirable to etch a hole through intrinsic GaAs onto the source pad, generally made of metallic gold. Conventional etch procedures, involving isotropic etches, yield holes with etch facets at angles of typically 45 to 55 degrees. It is highly desirable to etch holes with straight sides (right angle pill box holes) with a minimum of lateral etching. Such a procedure permits higher packing density on the wafer which yields more devices for the same amount of processing and semiconductor material.

Photoetching is highly attractive as a fabrication procedure for semiconductors because chemical reaction is usually confined to the part of the surface irradiated. Thus, the radiation can be used to confine the etching reaction to the area desired. This is usually called anisotropic etching. It is also desirable to carry out such a procedure without the use of external power supply or electrical connection to the device being fabricated. Such electrical connections would be exceedingly tedious because of the small size of such devices and the large number of devices on each wafer. Photoetching is described in a number of references including, for example, "Photoetching and Plating of Gallium Arsenide" by R. W. Haisty, *Journal of the Electrochemical Society*, 108, page 790 (August 1961); "Selective Photoetching of Gallium Arsenide" by F. Kuhn-Kuhnenfeld, *J. Electrochem. Soc.*, 119, page 1063 (August 1972); L. Hollan et al, *J. Electrochem. Soc.*, "Solid-State Science and Technology," 126 No. 5, page 855 (1979); and "Photoetching of InP Mesas for Production of mm-Wave Transferred-Electron Oscillators" by D. Lubzens, *Electronics Letters*, 13, page 171 (1977).

These references describe photoelectrochemical etching of n-type GaAs by oxidative decomposition. Here, holes are created by exposure of the semiconductor to radiation and these holes permit anodic oxidation of the GaAs.

It is highly desirable to have an etching process for intrinsic compound semiconductors which is anisotropic and can be directed to predetermined areas typically by irradiation. Photoetching is highly desirable in modern fabrication procedures for semiconductors because of reduced dimensions of many recently developed semiconductor devices, high precision requirements for these devices and simpler, less costly, and more rapid manufacturing procedures possible using such an etching procedure.

SUMMARY OF THE INVENTION

The invention is a process for making a semiconductor device in which intrinsic compound semiconductor material is etched by a photoelectrochemical etching procedure. The process is useful for a variety of compound semiconductors (i.e., II-VI and III-V compounds) but the III-V compounds are more extensively used. This photoelectrochemical etching procedure requires light incident on the area being etched, an area of high conductivity (e.g., metals) or p-type doping electrically attached to the surface of the semiconductor and an electrolyte that contains a suitable oxidizing agent and that dissolves the oxidation products of the III-V compound semiconductor. The photon energy of the light should be high enough so that electron-hole pairs are created. Generally, this requires a photon energy at least as great as the bandgap of the semiconductor. This process produces etching only where light is incident on the semiconductor surface, in a shape, extent and rate determined by the characteristics of the incident light. This makes possible highly accurate and precise patterns and geometric features on the semiconductor wafer. This allows greater packing density on the wafer and more desirable device characteristics.

DETAILED DESCRIPTION

Figure 1:
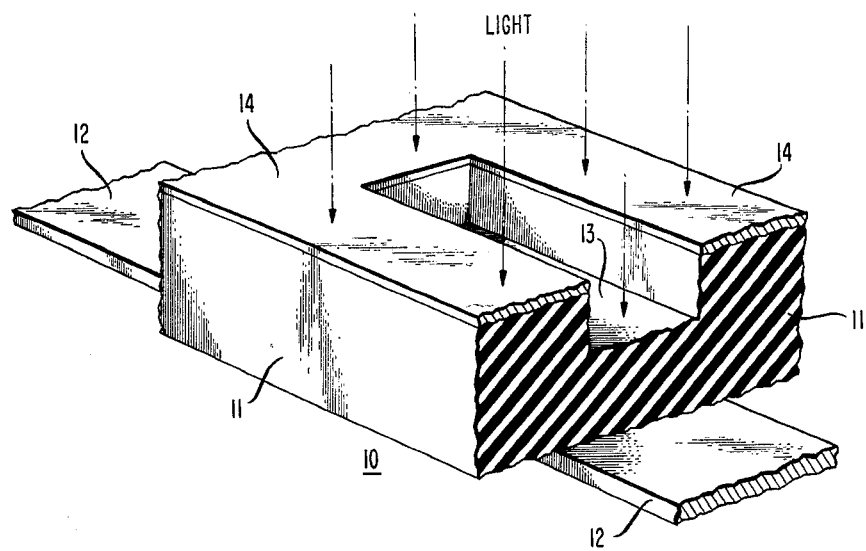
FIG. 1 shows in perspective view a channel etched in semi-insulating GaAs in accordance with the invention.

The invention is a photoelectrochemical etching procedure for various intrinsic and compensated compound semiconductors including II-VI compounds and III-V compounds. The process involves exposing the semiconductor to radiation of sufficient photon energy to create carriers in the semiconductor while the semiconductor is exposed to an electrolytic solution. On some part of the semiconductor, also exposed to the electrolytic solution, there should be a region of high conductivity (metal surface electrically attached to the semiconductor or a region where the semiconductor is doped p-type or heavily doped n-type). Most generally, this region should have electrons available at the surface at the Fermi energy. It is sometimes convenient to provide electrical conductivity through the semiconductor, usually by irradiation of the semiconductor to create carriers. The composition of the electrolytic solution is of importance. The electrolytic solution should contain an oxidizing agent strong enough to ensure oxidation of the semiconductor when exposed to light of the appropriate photon energy but not so strong as to lead to oxidation in the dark. The electrolytic solution should be of such composition so as to ensure dissolution of the oxidation products of the process. Optionally, some conductivity salts may be added to ensure rapid ionic conduction during the process. Also, a buffer system may be used to stabilize the pH of the solution. Often, one substance will serve more than one of the functions set forth above. Generally, intrinsic or compensated compounds are often used as substrate materials for various other active materials in compound semiconductor devices and have lower conductivity than the n-type or p-type material of the same compound semiconductor. Ideally, the number of holes and electrons would be equal and depend only on temperature; but often impurities, dislocations or other imperfections in the crystal, lead to a greater number of carriers than expected theoretically. Often, the compound semiconductor material is doped to provide traps for the holes or electrons present in the semiconductor material (compensated semiconductor material). A case in point is chromium doped gallium arsenide which is made highly insulating by this procedure. For this particular case (GaAs), doping levels of $10^{15}$ to $10^{17}$ chromium atoms per cubic centimeters ($10^{16}$ preferred) yield semi-insulating material with resistivities greater than $10^6$ ohm-cm (usually $10^7$ to $10^8$ ohm-cm).

The procedure is useful in the processing of a large number of compound semiconductors, including mixed compound semiconductors. Typical compound semiconductors are GaP, GaAs, AlAs, AlP, AlSb, InSb, InAs, InP, GaInAs, GaInP, GaInAsP, GaAlP and GaAlAs. The invention is usefully applied to undoped material, material grown in such a way as to have essentially equal numbers of hole and electron carriers and compensated material as described above. Oxygen is also often useful as a compensating material. Proton bombardment is also used.

Such semi-insulating (intrinsic or compensated) compound semiconductor material is used in a variety of devices, including as substrate material for microwave amplifiers, integrated circuits, modulator-laser combinations, numerics. Often, the active parts of the device are epitaxially grown onto the substrate material. Also useful are intrinsic epitaxial layers which are first photoetched and then doped, for example, by a thermal diffusion process.

The process involves photoelectrochemical oxidation where etching is desired. The light should be of sufficient photon energy to produce charge carriers. Generally, this is most easily done by ensuring that the photon energy of at least part of the radiation is greater than the bandgap of the semiconductor. Both monochromatic (such as a laser source) and broad band (such as an incandescent lamp) sources are useful. The radiation may also be used to increase conductivity inside the semiconductor from where oxidation takes place to where reduction takes place (on the more conducting part or more p-type part of the semiconductor).

Often, it is desirable to use a mask attached or close to the semiconductor surface to limit the part of the surface exposed to radiation. The shape of the etched hole is controlled by the direction of the radiation rays. For example, a straight-walled hole without undercutting can be made by using collimated (parallel-ray) radiation incident normal to the surface.

A great variety of oxidizing agents may be used provided they are neither too strong nor too weak as explained above. Also, the oxidizing agent should not interfere with the oxidation of the semiconductor. For example, the oxidizing agent should not form a precipitate with the oxidation products of the semiconductor.

A certain procedure is available for selecting a suitable oxidizing agent for a given intrinsic or semi-insulating compound semiconductor. This procedure involves determination of certain potentials for each semiconductor on an electrochemical scale (here on the hydrogen scale) for the particular electrolyte solution used in the photoelectrochemical etching procedure. The potentials are the potential of the conduction band minimum (abbreviated here as conduction-band potential) and the potential of the valence band maximum (valence-band potential). Also of interest is the Fermi potential under conditions where there is no potential drop in the compound semiconductor. Under these conditions, the bands in the semiconductor are flat and the Fermi potential under these conditions might be referred to as the flat band Fermi potential or the Fermi potential under flat band conditions. For an intrinsic semiconductor, the Fermi potential under flat band conditions is approximately in the middle of the gap between the valence band and the conduction band.

The detailed explanation of these potentials and their importance in electrochemical phenomena is given by A. J. Nozik in *Philosophical Transactions of the Royal Society London* A295 pp. 453–470 (1980). This reference also contains some data on these potentials in aqueous electrolyte solution with pH=1.0. The two potentials (conduction-band minimum and valence band maximum) are: for GaP, $-1.0$ and $+1.2$; for GaAs, $-0.7$ and $+0.6$; and for InP, $-0.2$ and $+1.2$. These potentials change somewhat with the pH and composition of the electrolyte solution. For example, at pH=2.1, InP has a conduction-band potential and valence band potential of $-0.35$ volts and $+0.90$ volts. For pH=4.8, these potentials are $-0.45$ and $+0.80$; for pH=9.2, they are $-0.65$ and $+0.70$.

For an intrinsic or semi-insulating semiconductor, the flat band Fermi level is approximately in the middle of the forbidden gap between the valence band and the conduction band. The reduction of the oxidizing agent takes place on a metal surface (or p-type surface) electrically attached to the compound semiconductor. Under flat band conditions, the Fermi level in the compound semiconductor is the same as in the metal. For oxidation to take place, the reduction potential of the oxidizing agent must be more positive than the flat band Fermi potential.

Therefore, a primary consideration in selecting an oxidizing agent for the photoelectrochemical oxidation procedure is that its reduction potential in the electrolytic solution is more positive than the flat band Fermi potential. In addition, to ensure that oxidation not take place in the absence of light, the reduction potential of the oxidizing agent should be more negative than the potential at the valence band maximum.

Although this procedure often permits selection of suitable oxidizing agents for particular compound semiconductors, it has two limitations. There is only a limited amount of data on semiconductors of interest, particularly three and four component compounds and some of the available data are unreliable or require extrapolations (i.e., to different solution compositions or pH values which are uncertain or often unreliable). Thus, this procedure often only suggests suitable oxidizing agents for use in this procedure.

Fortunately, there is an empirical procedure available for confirming the suitability of a particular oxidizing agent for photoelectrochemically oxidizing a particular compound semiconductor. This procedure involves taking a voltammogram of the compound semiconductor in the solution of interest with and without light illuminating its surface. A voltammogram is a plot of current against the potential applied to the compound semiconductor. With surface illumination, the initial onset of oxidation current (as the potential on the hydrogen scale is made more and more positive) occurs approximately at the flat band Fermi potential. Without illumination, the initial onset of oxidation current is usually more positive than the potential of the valence band maximum. The reduction potential of the oxidizing agent in the electrolytic solution to be used in the process should be between these two potentials (the flat band potential of the Fermi level and the valence band maximum).

Indeed, where uncertainty exists as to the electrochemical properties of the oxidizing agent, a voltammogram can be run on the oxidizing agent in the electrolytic solution of interest. Here, the ideal oxidizing agent should show no reduction current at a potential more positive than the potential at the volence band maximum (where oxidation current first appeared in the dark in the voltammogram of the compound semiconductor) but show reduction current between the above potential and the flat band Fermi potential. Such experiments can be done rapidly and easily so as to select suitable oxidizing agents for this process.

In addition, the oxidizing agent should be compatible with other parts of the process. For example, it should not react with the oxidation products of the semiconductor oxidation in such a way as to stop the reaction (i.e., form a precipitate, etc.) and should preferably be stable and easily handled.

Some suitable oxidizing agents for intrinsic GaP and InP are given by A. A. K. Vervaet, W. P. Gomes and F. Cardon in *Journal of Electroanalytical Chemistry* 91, pp. 133–136 (1978). Generally, oxidizing agents containing iron should not be used with compound semiconductors containing phosphorus because of the possible precipitation of iron phosphate.

A large variety of oxidizing agents together with their potentials is given in a book by W. M. Latimer entitled *The Oxidation States of the Elements and Their Potentials in Aqueous Solutions*, Prentice-Hall, New York, 1938.

A variety of oxidizing agents are given below together with their potentials and possible applications.

TABLE I

| Redox Couple | Potential | Applications |
|---|---|---|
| $V^{+5} V^{+4}$ | 1.0 | InP, related semiconductors |
| $V^{+4} V^{+3}$ | 0.31 | GaAs, InP |
| $I_3^- I^-$ | 0.36 | large variety |
| $PtCl_6^{-2} PtCl_4^{-2}$ | 0.72 | large variety |
| $Fe^{+3} Fe^{+2}$ | 0.77 | semiconductors not containing phosphorus |
| $IrCl_6^{-2} IrCl_6^{-3}$ | 1.0 | large variety |
| $Cr^{+6} Cr^{+3}$ | 1.0 | large variety |

The concentration of the oxidizing agent in the electrolytic solution may vary over a large range but from 0.1 Molar to saturation yields excellent results. Below 0.1 Molar, the etching rate is often too slow or the oxidizing agent is used up too rapidly. The concentration range from 0.25 to 1.5 Molar is often most convenient.

Substances useful in dissolving the oxidation products of the compound semiconductor depend on the particular compound involved. Often moderate amounts of acid or base are enough to ensure solubility. Typically, pH values less than 4 or greater than 8 are preferred. In the case of aluminum and to some extent indium, an acidic solution is preferred, and the addition of chloride ion is often helpful in dissolving the resulting oxide. In the case of gallium arsenide, the presence of phosphate ion (provided iron is not used as the oxidizing agent), which is often used as part of the buffer system, is usually sufficient to ensure dissolution of the oxidation products. The addition of conducting salts is also beneficial. Typical amounts are 0.05 to 1 Molar solutions. Any substance that is substantially ionized and does not interfere in the oxidation-reduction process can be used. This requirement is often met by substances serving other functions in the solution such as a buffer or a substance to ensure dissolution of the oxidation products of the semiconductor.

Although a buffer system is not required to carry out the procedure it does ensure stability of the pH in the electrolytic solution which tends to stabilize the reaction. Typical buffer systems are the phosphate system (both the dihydrogen phosphate-hydrogen phosphate system and the hydrogen phosphate-phosphate system) and the citrate system. The concentrations involved may vary over large limits and are generally typical of those used in conventional electroplating processes. Typically, 0.05 to 1.0 Molar solutions are used.

In some cases, moderate amounts of acid or base are used to ensure that the solution remains strongly acid or basic throughout the procedure.

A particular electrolytic solution useful in the photoelectrochemical etching of intrinsic gallium arsenide is as follows: 0.5 Molar ferric sulfate, 2 Molar sulfuric acid, remainder water. The process is conveniently carried out at about room temperature although the light does heat the solution slightly. Increased reaction rate may be achieved by heating the solution.

The invention is conveniently illustrated by a particular example carrier out on a particular device. FIG. 1 shows a part of a structure of a gallium arsenide field-effect transistor. Shown is the semi-insulating gallium arsenide 11 which forms the substrate of the device. Also shown is the source pad 12 of the transistor together with a partially completed via hole 13. On top of the device is a metallic mask 14 usually made of gold which limits etching to predesignated areas. It is desired to etch the via hole down to the source pad and subsequently fill this via hole with conducting metal (usually gold). In this way, an electrical connection can be made between source pad and the header subsequently formed on the top surface. Use of parallel light rags ensures straight-walled sides, thus minimizing undercutting and lateral etching. Via holes etched in this way minimize the required size of the holes and permit greater packing density on the semiconductor wafer.

Figure 2:
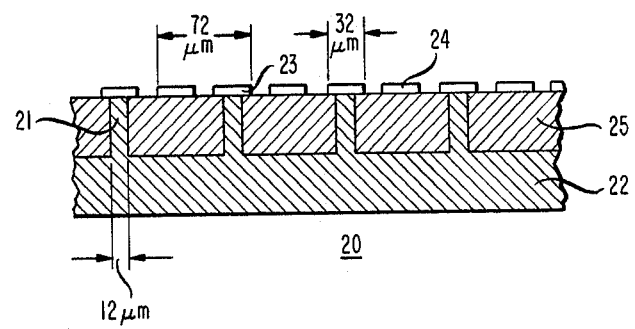
FIG. 2 shows a side view of a wafer with several GaAs devices showing channels or holes through semi-insulating GaAs which are used to electrically connect to the device source pad.

A typical procedure for carrying out the etch procedure is as follows: the procedure is illustrated for semi-insulating gallium arsenide. The wafer usually mounted on a sapphire disk with proper masks as partially shown in FIG. 2 is immersed in an aqueous solution of 0.5 Molar ferric sulfate and 2.0 Molar sulfuric acid. The surface is irradiated with collimated (made parallel) radiation by proper use of a lens system. Mild agitation is provided either by a stirrer or movement (i.e., vibration) of the wafer. The light may be monochromatic (as in a laser) or broad-band as in a tungsten-halogen lamp or halogen lamp. Some energy components of the radiation should be greater than the bandgap of the semiconductor so as to create carriers for the oxidation process. Some evidence exists that radiation energy components close to the bandgap are particularly effective in the process.

FIG. 2 shows a side view of a semiconductor wafer 20 with a number of GaAs-FET in which the via hole 21 is filled with gold and the gold plating 22 on the bottom side of the device is completed. Shown are the source pads 23, drain pads 24 and the semi-insulating GaAs 25. The various dimensions of a typical device are also shown.

What is claimed is:

1. A process for fabricating a device comprising at least one semi-insulating III–V compound semiconductor, said semi-insulating III–V compound semiconductor having resistivities greater than $10^6$ ohm-cm, comprising the step of photoelectrochemically etching the semi-insulating III–V compound semiconductor using an oxidation-reduction reaction in an electrolytic solution characterized in that
   a. the oxidation reaction is carried out by illuminating the semi-insulating III–V compound semiconductor with radiation comprising photon energy at least as great as the bandgap of the compound semiconductor so as to produce holes that permit oxidation of the compound semiconductor,
   b. the electrolytic solution comprises oxidizing agent with reduction potential in the electrolytic solution between the flat band potential of the Fermi level and the potential of the maximum of the valence band, and
   c. the oxidizing agent is reduced on a metallic or p-type surface electrically connected to the III–V compound semiconductor.

2. The process of claim 1 in which the intrinsic III–V compound semiconductor is selected from the group consisting of GaP, GaAs, AlAs, AlP, AlSb, InSb, InAs, InP GaInAs, GaInP, GaInAsP, GaAlP and GaAlAs.

3. The process of claim 2 in which the intrinsic III–V compound semiconductor is GaAs.

4. The process of claim 3 in which the III–V compound semiconductor is compensated GaAs.

5. The process of claim 4 in which the GaAs is made semi-insulating by doping with chromium in the concentration range from $10^{15}$ to $10^{17}$ atoms per cubic centimeters.

6. The process of claim 1 in which the radiation originates from a laser source.

7. The process of claim 6 in which the oxidizing agent is ferric ions.

8. The process of claim 7 in which the electrolytic solution comprises 0.5 Molar ferric sulfate and 2.0 Molar sulfuric acid.

9. The process of claim 1 in which the oxidizing agent is selected from the group consisting of pentavalent vanadium, quadravalent vanadium, $I_3^-$, $PtCl_6^{-2}$, $Fe^{+3}$, $IrCl_6^{-2}$ and hexavalent chromium.

10. The process of claim 9 in which the concentration of the oxidizing agent ranges from 0.1 Molar to saturation.

11. The process of claim 10 in which the concentration range is from 0.25 to 1.5 Molar.

12. The process of claim 1 in which the electrolytic solution has a pH less than 4.

13. The process of claim 1 in which the electrolytic solution has a pH greater than 8.

14. The process of claim 1 in which the electrolytic solution comprises a buffer.

15. The process of claim 1 in which the device is a gallium arsenide field-effect transistor.

16. The process of claim 15 in which the photoelectrochemical etching is used to produce a via hole in semi-insulating gallium arsenide.

* * * * *